(12) United States Patent
Koren et al.

(10) Patent No.: US 11,348,656 B2
(45) Date of Patent: May 31, 2022

(54) EFFICIENT RESOURCE SHARING

(71) Applicant: EMC IP Holding Company LLC, Hopkinton, MA (US)

(72) Inventors: Henrik Koren, Petach Tikva (IL); Ilan Yosef, Petach Tikva (IL)

(73) Assignee: EMC IP Holding Company LLC, Hopkinton, MA (US)

(*) Notice: Subject to any disclaimer, the term of this patent is extended or adjusted under 35 U.S.C. 154(b) by 148 days.

(21) Appl. No.: 16/803,295

(22) Filed: Feb. 27, 2020

(65) Prior Publication Data

US 2021/0272646 A1 Sep. 2, 2021

(51) Int. Cl.
*G11C 29/38* (2006.01)
*G06F 9/50* (2006.01)

(52) U.S. Cl.
CPC ............ *G11C 29/38* (2013.01); *G06F 9/5005* (2013.01)

(58) Field of Classification Search
None
See application file for complete search history.

(56) References Cited

U.S. PATENT DOCUMENTS

| | | | |
|---|---|---|---|
| 2001/0027501 A1* | 10/2001 | O'Hare | G06F 12/1483 710/107 |
| 2008/0022370 A1* | 1/2008 | Beedubail | H04L 63/102 726/4 |
| 2011/0191485 A1* | 8/2011 | Umbehocker | H04L 63/0428 709/229 |
| 2016/0366183 A1* | 12/2016 | Smith | H04L 63/101 |
| 2017/0286265 A1* | 10/2017 | Moth | G06F 11/3644 |
| 2019/0155515 A1* | 5/2019 | Farey | G06F 3/0659 |

* cited by examiner

*Primary Examiner* — April Y Blair
*Assistant Examiner* — Matthew W Wahlin
(74) *Attorney, Agent, or Firm* — Daly, Crowley, Mofford & Durkee, LLP

(57) ABSTRACT

A method comprising: identifying, by a resource manager, a resource of a storage system, the resource being one which a testing system lacks permission to use for testing the storage system; adding, by the resource manager, the resource to a group of resources which the testing system is permitted to use for testing the storage system, wherein adding the resource to the group includes granting the testing system a temporary permission to use the resource for testing the storage system; allocating the resource to a test that is performed by the testing system; and removing, by the resource manager, the resource from the group wherein removing the resource from the group includes revoking the temporary permission.

20 Claims, 8 Drawing Sheets

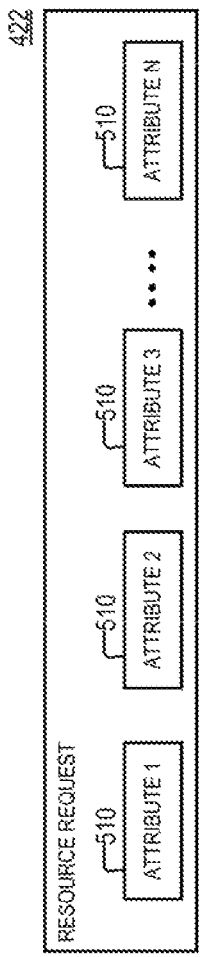

EFFICIENT RESOURCE SHARING

BACKGROUND

A distributed storage system may include a plurality of storage devices (e.g., storage arrays) to provide data storage to a plurality of nodes. The plurality of storage devices and the plurality of nodes may be situated in the same physical location, or in one or more physically remote locations. The plurality of nodes may be coupled to the storage devices by a high-speed interconnect, such as a switch fabric.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method is provided comprising: identifying, by a resource manager, a resource of a storage system, the resource being one which a testing system lacks permission to use for testing the storage system; adding, by the resource manager, the resource to a group of resources which the testing system is permitted to use for testing the storage system, wherein adding the resource to the group includes granting the testing system a temporary permission to use the resource for testing the storage system; allocating the resource to a test that is performed by the testing system; and removing, by the resource manager, the resource from the group wherein removing the resource from the group includes revoking the temporary permission.

According to aspects of the disclosure, a system is provided, comprising: a memory; and one or more processors operatively coupled to the memory, the one or more processors being configured to perform the operations of: identifying a resource of a storage system, the resource being one which a testing system lacks permission to use for testing the storage system; adding the resource to a group of resources which the testing system is permitted to use for testing the storage system, wherein adding the resource to the group includes granting the testing system a temporary permission to use the resource for testing the storage system; allocating the resource to a test that is performed by the testing system; and removing the resource from the group wherein removing the resource from the group includes revoking the temporary permission.

According to aspects of the disclosure, a non-transitory computer-readable storage medium is provided that stores processor-executable instructions, which, when executed by one or more processors, cause the one or more processors to perform the operations of: identifying a resource of a storage system, the resource being one which a testing system lacks permission to use for testing the storage system; adding the resource to a group of resources which the testing system is permitted to use for testing the storage system, wherein adding the resource to the group includes granting the testing system a temporary permission to use the resource for testing the storage system; allocating the resource to a test that is performed by the testing system; and removing the resource from the group wherein removing the resource from the group includes revoking the temporary permission.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

FIG. 5 is a diagram of an example of a resource request, according to aspects of the disclosure;

FIG. 6 is a diagram of an example of a resource database, according to aspects of the disclosure;

DETAILED DESCRIPTION

Before describing embodiments of the concepts, structures, and techniques sought to be protected herein, some terms are explained. In some embodiments, the term "I/O request" or simply "I/O" may be used to refer to an input or output request. In some embodiments, an I/O request may refer to a data read or write request.

Figure 1:
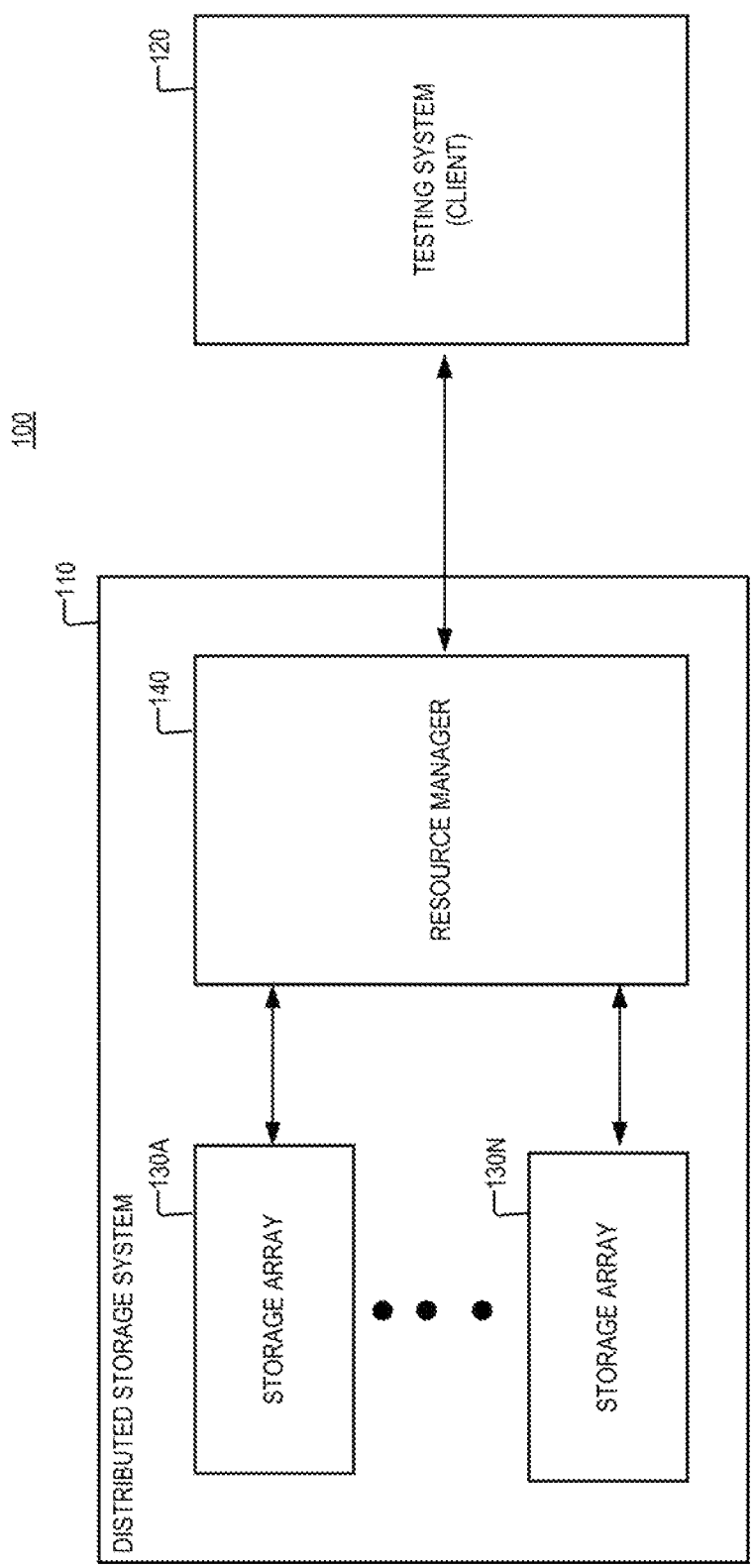
FIG. 1 is a diagram of an example of a system, according to aspects of the disclosure.

FIG. 1 is a diagram of an example of a system 100, according to aspects of the disclosure. The system 100 may include a storage system 110 and a testing system 120 for testing the storage system 110. The storage system 110 may include any suitable type of storage system, such as a content-addressable storage (CAS) system, an enterprise storage system, a midrange storage system, etc. In this regard, it will be understood that the present disclosure is not limited to any specific type of storage system. The testing system 120 may include one or more computing devices that are arranged to perform a plurality of tests on the storage system 110 (e.g., see tests 152 in FIG. 2). The tests may include any suitable type of test that is customarily used to test the performance of (and/or debug) storage systems and/or other types of software. For example, the tests may include performance tests, user interface (UI) tests, etc. In some implementations, the testing system may be implemented by using one or more computing devices, such as the computing device 1200, which is discussed further below with respect to FIG. 2.

The storage system 110 may include one or more storage arrays 130 and a resource manager 140. Any of the storage arrays 130 may include one or more storage servers (not shown). Each of the storage servers may be implemented by using any suitable type of computing device. In some implementations, any of the storage servers in the storage arrays 130 may be implemented by using a computing device, such as the computing device 1200, which is discussed further below with respect to FIG. 12. The resource manager 140 may include any suitable system that is configured to allocate resources for tests that are performed on the storage system 110 by the testing system 120. The resource manager 140 may be implemented by using any suitable type of computing device, such as the computing device 1200, which is discussed further below with respect to FIG. 12. Although the resource manager 140 is depicted as a separate device, in some implementations, the resource manager 140 may be integrated into any of the servers in one of the storage arrays 130. Although in the example of FIG. 1 the resource a manager is part of the storage system 110, alternative implementations are possible in which the resource manager 140 is deployed outside of the storage system 110.

Figure 2:
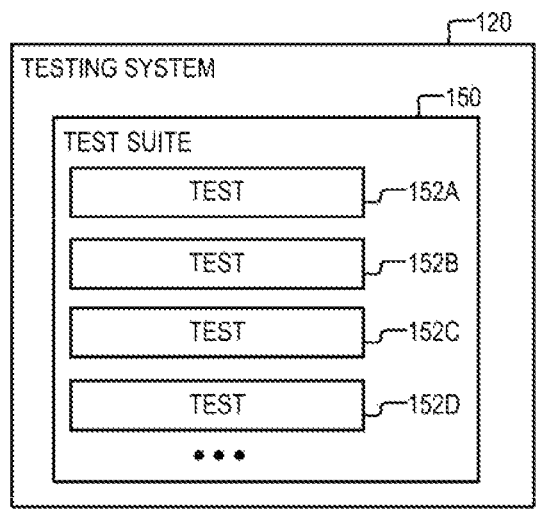
FIG. 2 is a diagram of an example of a testing system that is part of the system of FIG. 1, according to aspects of the disclosure.

FIG. 2 is a schematic diagram illustrating the operation of the testing system 120 in further detail. The testing system 120 may be configured to perform a plurality of tests 152 on the storage system 110. The tests 152 may be part of a test suite 150. Any of the tests 152 may be arranged to test a particular capability of the storage system 110. For example, a given one of the tests 152 may be configured to test the speed at which one of the storage servers in the storage system 110 performs a particular operation. To perform the given test, the testing system 120 may transmit a resource request to the resource manager 140. The resource request may specify one or more parameters which a storage server must possess in order for the storage server to be used for the performance of the given test. For instance, in one particular example, the request may specify that any server that is tested with the given test must possess at least 10 CPUs and 20 Gb of RAM. In response to receiving the resource request, the resource manager 140 may identify a server, which (i) possess the specified attributes, and which (ii) the storage system is permitted to access. Afterwards, the resource manager 140 may transmit a response to the testing system 120, which communicates that the identified server has been allocated to the given test. After receiving the response, the testing system may perform the given test by using the identified storage server. Performing the test may include transmitting to the storage sever series of requests to perform an action and recording the speed at which the action is performed. It will be understood that the present disclosure is not limited to any specific type of test being performed on the storage system 110, as those of ordinary skill in the art will readily recognize that a variety of tests can be devised for testing the performance/operation of a storage system and/or another system.

Figure 3:
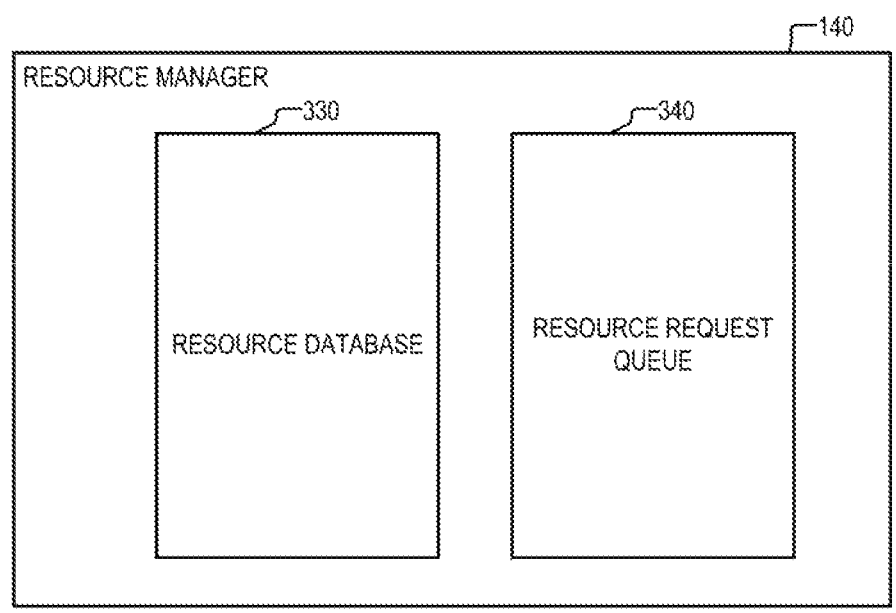
FIG. 3 is a diagram of an example of a resource manager that is part of the system of FIG. 1, according to aspects of the disclosure.

FIG. 3 is a schematic diagram illustrating the operation of the resource manager 140 in further detail. According to the present disclosure, the resource manager 140 is configured to dynamically manage a pool of resources (e.g., see resource pool 410 of FIG. 4) of the storage system 110, which can be used (by the testing system 120) to perform various tests on the storage system 110. As used throughout the disclosure, the term resource may refer to one or more of a server, an array of servers, a virtual machine, and/or any other suitable type of virtual or physical computing unit.

In some respects, the resource manager 140 may be arranged to dynamically increase or decrease the size of the pool by adding or removing resources from the pool. The ability to dynamically add resources to the pool is advantageous because it can increase the speed at which a test suite can be completed by the testing system 120. As can be readily appreciated, a test suite may include hundreds and even thousands of tests, and some of those tests may compete for resources. In this regard, increasing the size of the pool to include additional resources may reduce the number of tests in the test suite that would be stuck waiting for other tests to complete and release resources that are necessary for the execution of the former, thereby decreasing competition for resources among the tests in the test suite, and reducing the overall speed at which the test suite can be completed. In some implementations, it has been found that a suite that normally takes two days two complete by using conventional testing arrangements can be completed in the span on hours when dynamic resource allocation is used.

The resource manager 140 may include a resource database 330 and a buffer 340. The resource database 330 may identify a pool of resources, which the testing system 120 is permitted to access for the purpose of performing the tests 152 on the storage system 110. An example of one possible implementation of the resource database 330 is discussed further below with respect to FIG. 6. However, it will be understood that the present disclosure is not limited to any specific implementation of the resource database 330. The buffer 340 may include one or more data structures where resource requests received (at the resource manager 140) are stored before they are completed by the resource manager 140. The buffer 340 may be implemented by using a (waiting) queue and/or any other suitable type of data structure.

Figure 4:
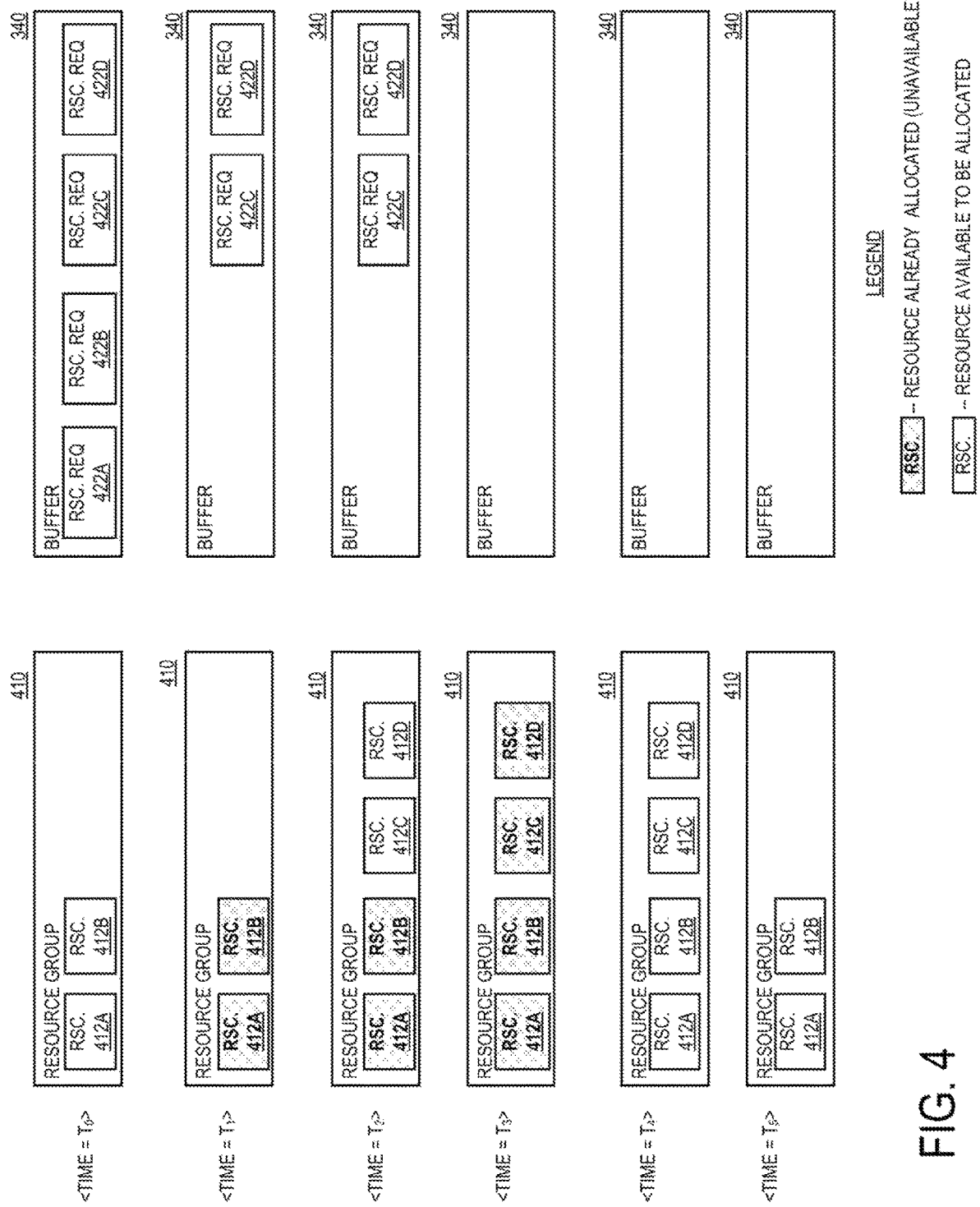
FIG. 4 is a diagram illustrating the operation of the resource manager of FIG. 3, according to aspects of the disclosure.

FIG. 4 is a diagram illustrating the operation of the resource manager 140. Shown in FIG. 4 are a resource pool 410 and the buffer 340 at different stages of the operation of the resource manager 140.

At time $T_0$, resources 412a and 412b are part of the pool 410, and the buffer 340 includes resource requests 422a, 422b, 422c, and 422d. According to the present example, resource request 422a includes a request for a resource needed for executing test 152a; resource request 422b includes a request for a resource needed for executing test 152b; resource request 422c includes a request for a resource needed for executing test 152c; and resource request 422d includes a request for a resource needed for executing test 152d.

At time $T_1$, resource 412a is allocated to test 152a, in response to resource request 422a; and resource 412b is allocated to test 152b in response to resource request 422b. After resource requests 422a and 422b are completed (i.e., by allocating resources 412a and 412b, respectively), resource requests 422a and 422b are removed from the buffer 340. Furthermore, after resource 412a is allocated to test 152a, resource 412a is unavailable to service other resource requests 422 until test 152a is completed. Similarly, after resource 412b is allocated to test 152b, resource 412a becomes unavailable to service other resource requests 422 until test 152b is completed. In this regard, because there are no more available resources in the pool 410, resource requests 422c and 422d remain in the buffer 340, waiting for additional resources to be added to pool 410.

At time $T_2$, pool 410 is expanded to include resources 412c and 412d. The manner in which resources 412c and 412d are added to the pool 410 is discussed further below with respect to FIG. 10.

At time $T_3$, resource 412c is allocated to test 152c, in response to resource request 422c; and resource 412d is allocated to test 152d, in response to resource request 422d. After resource requests 422c and 422d are completed (i.e., by allocating resources 412*c* and 412*d*, respectively), resource requests 422*c* and 422*d* are removed from the buffer 340.

At time $T_4$, tests 152*a-d* are completed, and resources 412*a-d* become available to service new resource requests.

At time $T_5$, resources 412*c* and 412*d* are removed from the pool 410. The manner in which resources 412*c* and 412*d* are removed from the pool 410 is discussed further below with respect to FIG. 11.

According to the example of FIG. 4, the pool 410 includes a group of resources 412, which the testing system 120 has a permission to use for the purpose of testing the storage system 110. Adding a resource 412 to the pool 410 may include granting the testing system 120 a permission to use the resource 412 for the purpose of testing the storage system. Removing the same resource 412 from the pool 410 may include revoking the permission of the testing system 120 to use the resource 412 for the purpose of testing the storage system 110.

According to the example of FIG. 4, each of resources 412 is part of the storage system 110. Depending on how various security policies are implemented in the storage system 110, granting the testing system 120 a permission to use a resource 412 of the storage system 110 for the purpose of testing the storage system 110 may include granting the testing system 120 a general permission to access the resource 412. However, in some implementations, granting the testing system 120 a permission to use a resource 412 of the storage system 110 for the purpose of testing the storage system 110 may include granting the storage system permission that is limited to performing specific operation(s) on the resource 412.

Furthermore, granting the testing system 120 a permission to use a resource 412 of the storage system 110 for the purpose of testing the storage system 110 may include modifying one or more system policy files (or other data structures) to indicate that the testing system 120 is permitted to use the resource 412. Revoking the permission, on the other hand, may include modifying the same file(s) (or data structure(s)) to indicate that the testing system 120 no longer has permission to use the resource 412 for the purpose of testing the storage system 110.

According to the example of FIG. 4, the testing system 120 is granted a permanent permission to use resources 412*a* and 412*b* for the purpose of testing the storage system 110. Furthermore, according to the example of FIG. 4, the testing system 120 is granted a temporary permission to use resources 412*c* and 412*d* for the purpose of testing the storage system 110. A "temporary permission" may be a permission that remains in effect for an entire period of the operation of a resource manager 140, whereas temporary permission is a permission that remains in effect during only a portion of the same period. The period may include any suitable period in the operation of the resource manager 140. For example, the period may be one starting when the resource manager is booted and ending when the resource manager 140 is shut down. As another example, the period may be one starting when the test suite 150 is instantiated and ending when the test suite 150 is completed.

In some implementations, temporary permissions may be granted and revoked as described further below with respect to FIGS. 10 and 11, respectively. For instance, a temporary permission may be granted after the period in the operation of the testing system 120 has started and/or revoked before the same period has ended. Although in the example of FIG. 4, the pool 410 includes resources 412 for which the testing system 120 has permanent permissions, alternative implementations are possible in which the pool 410 contains only resources 412 for which the testing system 120 has temporary permissions.

According to the example of FIG. 4, the pool 410 is implemented in a centralized manner by using the resource database 330. If the resource database 330 includes an entry corresponding to a resource 412, this resource 412 is considered part of the pool 410. If the resource entry does not include an entry that corresponds to the resource 412, the resource is not considered part of the pool 410. In operation, when completing the resource requests 422*a-d*, the resource manager 140 may identify available resources 412 for the resource requests 422 by searching the resource database 330. Although in the present example the pool 410 is implemented in a centralized manner, alternative implementations are possible in which the pool 410 is implemented in a decentralized manner (e.g., without using a single structure that identifies all resources that are part of the pool 410). In such implementations, the resource manager 140 may identify which resources are part of the pool 410 by scanning one or more policy files (or data structures) of the storage system 110 to identify resources 412 which the testing system 120 is permitted to use for the purpose of testing the storage system 110. Stated succinctly, the present disclosure is not limited to any specific method for implementing the pool 410. In other words, according to the present disclosure, the pool 410 may constitute any group of resources 412, which the testing system 120 has a permission to use, irrespective of how the group is defined, if at all.

According to example of FIG. 4, when the testing system is granted a permission to use a resource 412 of the storage system 110 for the purposes of testing the storage system 110, the storage system 110 may generate a new entry (e.g., one of the database entries 610, which are shown in FIG. 6) corresponding to the resource and add the new entry to the resource database 330. The new entry may include an identifier corresponding to the resource 412 and one or more attributes of the resource. By contrast, when the same permission is revoked, the entry corresponding to the resource is deleted from the resource database.

According to the example of FIG. 4, each of the resource requests 422 is completed by allocating a resource 412 to a respective test 152 that is associated with the request. Allocating a resource 412 to a test that is associated with a resource request 422 may include transmitting, to the testing system 120, a response identifying the resource 412. The response may include a descriptor of the resource 412, which identifies one or more of an address for accessing the resource, a port number of the resource, a credential for accusing the resource, and/or any other information that is needed for executing the test 152 on the resource 412. Furthermore, in some implementations, the response may identify the test, which the resource is being allocated to either directly or indirectly. When the test 152 is identified directly, the resource 412 may include an identifier corresponding to the test 152. When the test 152 is identified indirectly, the resource request may include an identifier corresponding to the resource request 422 (which associated with the test and/or the response), and the testing system 120 may identify the test based on the resource request identifier. Additionally, or alternatively, in some implementations, allocating a resource 412 to a test 152 may include transmitting a response to a resource request 422 that is associated with the test 152 and storing (in resource manager 140) an indication that even though the resource 412 is part of the pool 410, that resource cannot be allocated to other tests 152 until the former test 152 is completed by the testing system 120.

Although in the example of FIG. 4 only four resources 412 are part of the pool 410, it will be understood that any number of resources may be part of the pool 410. Although in the example of FIG. 4 only four resource requests 422 are stored in the buffer 340, it will be understood that any number of resource requests 422 can be stored in the buffer 340. Although in the example of FIG. 4 each of resources 412c and 412d is used to execute only one test 152 before the temporary permission to use the resource is revoked, alternative implementations are possible in which any of the resources 412 and 412d can be used to execute multiple tests 152 before the temporary permission for this resource is revoked.

According to aspects of the disclosure, each resource 412 in the storage system 110 may have a default owner. The default owner may be a user (e.g., a specific resource) or a user group (a group of resources). The default owner for any resource 412 may be set by configuring various system policies in a well-known fashion before the testing system 120 is booted and/or before the test suite 150 is initialized. When the testing system 120 is granted a temporary permission to use a given resource 412, the ownership of the given resource 412 may be changed for a limited time period of time from the default owner to the testing system 120 (e.g., by modifying one or more system policy files or data structures that are used to set access permissions in the storage system 110). Similarly, when the temporary permission is revoked, ownership of the resource may be returned to the default owner (e.g., by modifying one or more system policy files or data structures that are used to set access permissions in the storage system 110). In some implementations, the testing system 120 may be the default owner of resources 412 for which it has permanent permission.

FIG. 5 is a diagram of an example of a resource request 422, according to aspects of the disclosure. The resource request 422 may be the same or similar to any of the resource requests 422a-d, which are discussed above with respect to FIG. 4. As illustrated, the resource request 422 may specify a plurality of attributes 510. The attributes 510 may be specified either directly or indirectly. When the attributes 510 are specified directly, the attributes 510 may be encapsulated in the resource request 422. When the attributes 510 are specified indirectly, the resource request 422 may include an identifier that can be used to retrieve the attributes 510 from an external location.

As noted above, the resource request 422 may be associated with a respective test 152 in the test suite 150. In this regard, each of the attributes 510 may identify a characteristic, which a resource has to possess, in order for the resource to be used in executing the respective test 152. For example, in some implementations, each of the attributes 510 may identify a resource characteristic, such as a number of processors available in a resource (e.g. when the resource is a server or to a virtual machine), a number of servers available in a resource (e.g., when the resource is a storage array), an amount of memory that is available to a resource, an amount of bandwidth that is available to a resource, a network domain which the resource needs to be part of, a type of network protocol which the resource must support (e.g., TCP/IP, InfiniBand, etc.), a type of network adapter which the resource must possess (e.g., an ethernet adapter, a fiberoptic adapter, etc.), and/or any other suitable resource characteristic. Although in the example of FIG. 5 the resource request 422 specifies a plurality of resource attributes, alternative implementations are possible in which only one attribute 510 is specified by the resource request 422.

FIG. 6 illustrates an example of a resource database 330, according to aspects of the disclosure. The resource database 330 may include a plurality of entries 610. Each entry 610 may correspond to a different one of a plurality of resources that are available in the storage system 110. Each entry 610 may include a resource identifier 612 and a set of one or more attributes 614, which correspond to the resource identified by the resource identifier 612. The attributes identified in the entries 610 may be the same type of attributes as the attributes 510.

Figure 7:
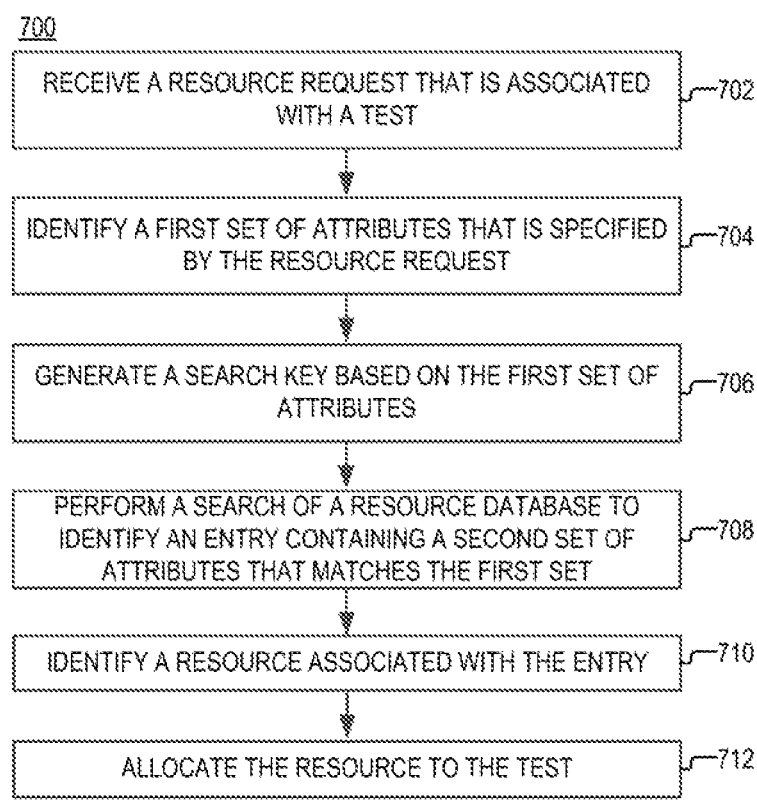
FIG. 7 is a flowchart of an example of a process, according to aspects of the disclosure.

FIG. 7 is a flowchart of an example of a process 700 for servicing resource requests, according to aspects of the disclosure. At step 702, the resource manager 140 receives a resource request. The resource request may be the same or similar to the resource request 422. The test associated with the resource request may be the same or similar to any of the tests 152 (see FIG. 2). At step 704, the resource manager 140 identifies a first set of attributes that is specified by the resource request. At step 706, the resource manager 140 generates a search key based on the first set of attributes. At step 708, the resource manager 140 performs a search of the resource database 330 by using the search key and retrieves, from the resource database 330, an entry 610 that matches the search key. At step 710, the resource manager 140 identifies a resource associated with the retrieved entry (e.g., based on the resource identifier 612 that is part of the retrieved entry 610). At step 712, the resource manager 140 allocates the resource to the test corresponding to the resource request (received at step 702).

In some implementations, the search key (generated at step 706) may include the first set of attributes specified by the resource request (received at step 702). Additionally, or alternatively, in some implementations, an entry in the resource database may match the search key only when the entry includes a second set of attributes 614 that matches the first set. Both the first set and the second set may include at least one attribute. Additionally, or alternatively, in some implementations, the first set of attributes and the second set of attributes may match one another when, for each attribute in the first set, the second set of attributes includes another attribute that matches the former attribute. In some implementations, two attributes may match one another if they are identical or otherwise similar to one another. For example, if the resource request (received at step 702) calls for a resource having at least 10 CPUs, the search key (generated at step 706) may also seek a resource having 10 CPUs. The search key may be matched by any entry in the resource database 330 whose respective resource includes 10 or more CPUs (e.g., an entry 610 having "10 or more CPUs" in its respective set of attributes 614).

Figure 8:
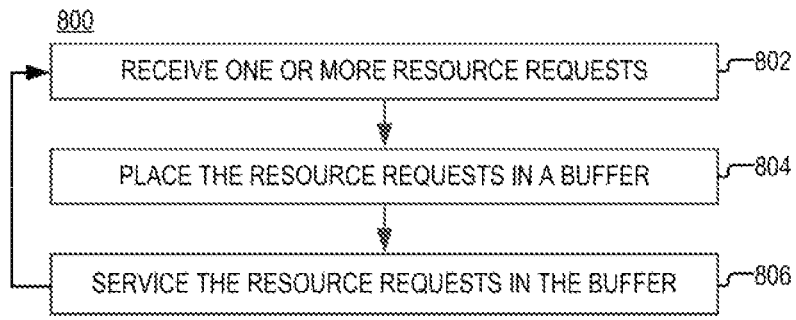
FIG. 8 is a flowchart of an example of a process, according to aspects of the disclosure.

FIG. 8 is a flowchart of an example of a process 800 for servicing resource requests, according to aspects of the disclosure. At step 802, a plurality of resource requests 422 is received at the resource manager 140. Each of the resource requests 422 may be transmitted by the testing system 120. Furthermore, each of the resource requests may be associated with a different one of the tests 152. At step 804, the resource manager 140 adds each of the resource requests to the buffer 340. At step 806, each of the resource requests 422 in the buffer 340 is completed by the resource manager 140. In some implementations, any of the resource requests 422 in the buffer 340 may be completed in accordance with a process 900, which is discussed further below with respect to FIG. 9.

Figure 9:
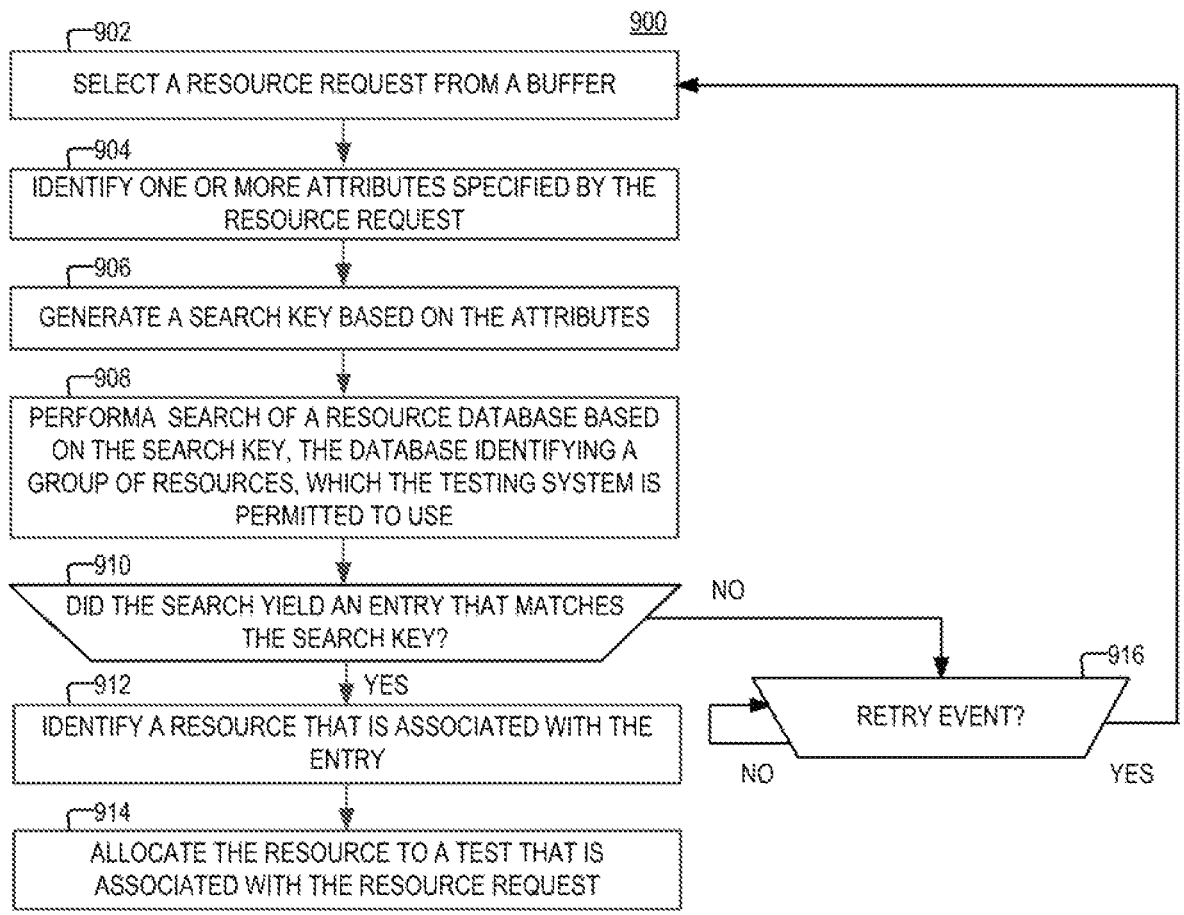
FIG. 9 is a flowchart of an example of a process, according to aspects of the disclosure.

FIG. 9 is a flowchart of an example of a process 900 for servicing a resource request that is stored in the buffer 340 (shown in FIG. 3), according to aspects of the disclosure. At step 902, the resource manager 140 selects the given resource request 422 from the buffer 340. At step 904, the resource manager 140 identifies a set of attributes specified by the given resource request 422. At step 906, the resource manager 140 generates a search key based on the set of attributes. At step 908, the resource manager performs a search of the resource database 330 is based on the search key. At step 908, the resource manager 140 determines whether the search has yielded an entry 610 that matches the search key. If the search has yielded such an entry, the process proceeds to step 912. Otherwise, if the search is unsuccessful, the process 900 proceeds to step 912. At step 912, the resource manager 140 identifies a resource 412 that is associated with the entry 610 (e.g., and entry 610 that is retrieved from the resource database 330 as a result of the search performed at step 908). At step 914, the resource manager 140 allocates the identified resource 412 to the test 152 that is associated with the given resource request 422. At step 916, the resource manager 140 detects whether a retry event 916 has been generated. If no retry event is detected, step 916 is repeated again. Otherwise, if a retry event is generated, the process 900 returns to step 902, and another attempt is made to complete the resource request 422.

In some implementations, the retry event may be generated after a predetermined time period has passed since the last unsuccessful attempt to complete the given resource request 422. Additionally, or alternatively, in some implementations, the retry event may be generated in response to one or more additional resources 412 being added to the pool 410. Additionally, or alternatively, in some implementations, the retry event may be generated in response to at least one of the tests 152 being completed and a resource 412 that has been allocated to that test 152 becoming available for allocation to other tests 152. In some implementations, the process 900 may be executed concurrently with the process 800. Additionally, or alternatively, in some implementations, a respective instance of the process 900 may be executed for each given resource request 422 that is stored in the buffer 340 (shown in FIG. 3).

Figure 10:
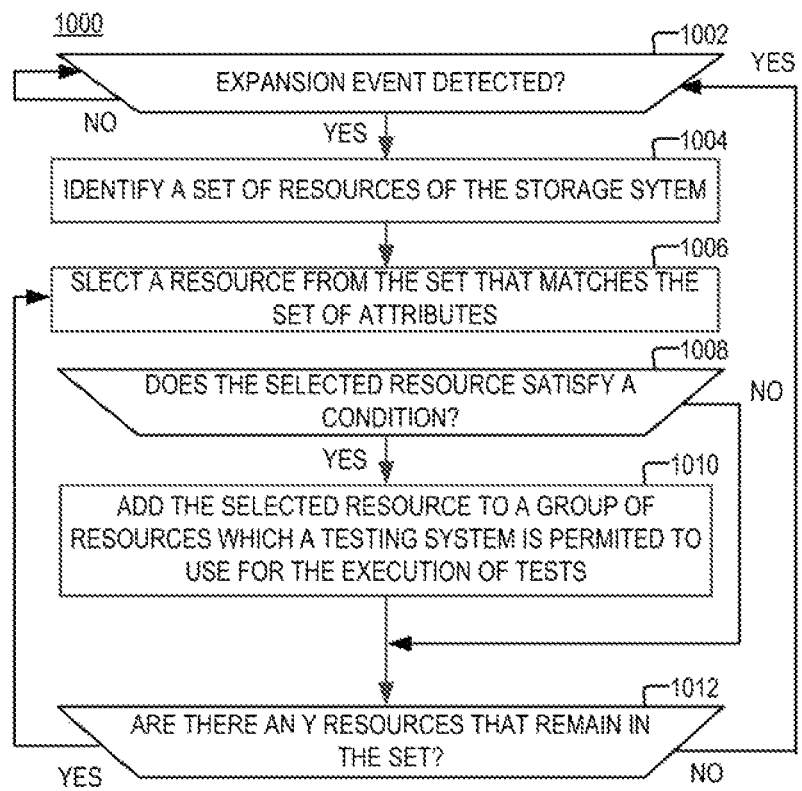
FIG. 10 is a flowchart of an example of a process, according to aspects of the disclosure.

FIG. 10 is a flowchart of an example of a process 1000 for granting a temporary permission to the testing system 120 to use one or more resources 412 of the storage system 110 for the purpose of testing the storage system 110. The process 1000 may be executed concurrently with the execution of the processes 800 and 900.

At step 1002, the resource manager 140 detects whether an expansion event is generated. At step 1004, the resource manager 140 identifies a set of resources 412 of the storage system 110. At step 1006, the resource manager 140 selects a resource 412 from the set (identified at step 1004). At step 1008, the resource manager 140 detects whether the selected resource 412 satisfies a predetermined condition. If the condition is satisfied, the process 1000 proceeds to step 1010. Otherwise, if the condition is not satisfied, the process 1000 proceeds to step 1012. At step 1010, the resource 412 (selected at step 1006) is added to the pool 410. At step 1012, the resource manager 140 determines if there are any resources 412 in the set (identified at step 1004) that remain to be processed. If there are resources 412 that remain to be processed, the process 1000 returns to step 1006 and another resource 412 is selected from the set (identified at step 1004). Otherwise, if all resources 412 in the set (identified at step 1004) have been processed, the process 1000 returns to step 1002.

As used throughout the disclosure, the term "expansion event" may include any suitable type of event that causes the resource manager 140 to perform steps 1004-1012. In some implementations, the expansion event (detected at step 1002) may be generated by a timer (in the resource manager 140). In such implementations, steps 1004-1012 may be performed at predetermined time intervals (e.g., every 12 or 24 hours). Additionally, or alternatively, in some implementations, the expansion event may be generated by the resource manager 140 in response to a new resource request 422 being received by the resource manager 140 from the testing system 120. Additionally, or alternatively, in some implementations, the expansion event may be generated (by the resource manager 140), at step 910 (or 916) of the process 900, when it is determined that there are no available resources 412 in the pool 410 to satisfy a resource request 422 that is stored in the buffer 340 (e.g., resources whose attributes match the attributes specified by the request).

In some implementations, the set of resources 412 may be identified (at step 1004) by performing a scan of the storage system 110. In some implementations, the scan may involve broadcasting one or more messages in the storage system 110, which call for resources 412 of the storage system 110 to identify themselves. In such implementations, the set may be identified based on responses that are issued by the resources 412 to the broadcast messages. Additionally, or alternatively, in some implementations, the scan may involve searching one or more data structures (e.g. files, etc.) that identify resources 412 in the storage system 110 that can be used for the execution of tests 152 by the testing system 120. Stated succinctly, the present disclosure is not limited to any specific method for identifying the set of resources 412 at step 1004.

According to aspects of the disclosure, adding a resource 412 of the storage system 110 to the pool 410 may include any action that results in the testing system 120 being granted a permission to use the resource 412 for the purpose of performing one or more tests on the storage system 110. Additionally, or alternatively, in some implementations, at least some of steps 1006-1012 may be executed once for each of the resources 412 in the set (identified at step 1004) before step 1004 is repeated again.

In some implementations, the condition tested at step 1008 may include any suitable type of condition for determining the suitability of a resource 412 for executing any of the tests 152. In some implementations, detecting whether the resource 412 (selected at step 1006) satisfies the condition may include detecting whether a load on the resource 412 is below the threshold. For example, determining whether the load is below a threshold may include detecting whether a CPU (and/or memory) utilization of the resource 412 is below the threshold. As another example, determining whether the load on the resource 412 is below a threshold may include detecting whether the arrival rate of I/O requests (and/or internal read/write requests) at the resource 412 is below a threshold, etc.

Additionally, or alternatively, in some implementations, the condition tested at step 1008 may include any suitable type of condition for determining whether the resource 412 is suitable for servicing any of the resource requests 422 that are currently stored in the buffer 340. In such implementations, detecting whether the condition is satisfied (at step 1008) may include detecting whether a set of attributes that are possessed by the resource 412 matches the respective set of attributes that is specified by any of the resource requests 422 that are currently stored in the buffer 340.

Figure 11:
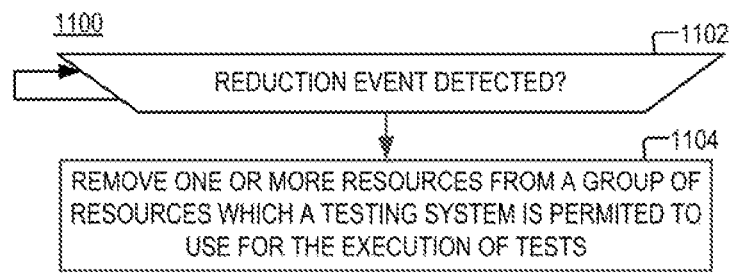
FIG. 11 is a flowchart of an example of a process, according to aspects of the disclosure.

FIG. 11 is a flowchart of an example of a process 1100 for removing resources from a group of resources, which a testing system is permitted to use for the execution of a test suite. At step 1102, the resource manager 140 detects whether a reduction event is generated. If a reduction event is generated, the process 1100 proceeds to step 1104. Otherwise, step 1102 is repeated again. At step 1104, the resource manager 140 removes one or more resources from the pool 410. Removing a resource of the storage system 110 from the pool 410 may include taking any action that revokes a permission of the testing system 120 to use the resource for the purpose of executing tests on the storage system 110. As noted above, the present disclosure is not limited to any specific method for revoking permissions.

As used throughout the disclosure, the term "reduction event" may include any event that results in step 1104 being executed. In some implementations, the reduction event may be generated by the resource manager 140 in response to the expiration of a timer. In such implementations, the reduction event may be generated after a predetermined time period has expired since the most recent expansion event that is generated in the resource manager 140 (e.g., 12 or 24 hours after the most recent expansion event). Additionally, or alternatively, in some implementations, the reduction event may be generated when one of the tests 152 is completed. As noted above, when one of the tests 152 is completed, a resource that has been allocated to the test is not longer in use, and this resource can be removed from the group.

In some implementations, a given resource 412 may be removed from the pool 410 when the given resource 412 is not in use by one of the tests in the testing system 120. Additionally, or alternatively, in some implementations, a given resource 412 may be removed from the pool 410, while the given resource 412 is being used by a test in the testing system 120. In such implementations, to remove the given resource 412 from the pool 410, the given resource 412 manager may transmit to the testing system 120 a request to stop execution of the test using the given resource 412. In response to the request, the testing system 120 may terminate the test and transmit, to the resource manager 140, a confirmation that the test has been terminated. Afterwards, upon receiving the confirmation, the resource manager 140 may remove the request from the pool 410.

Figure 12:
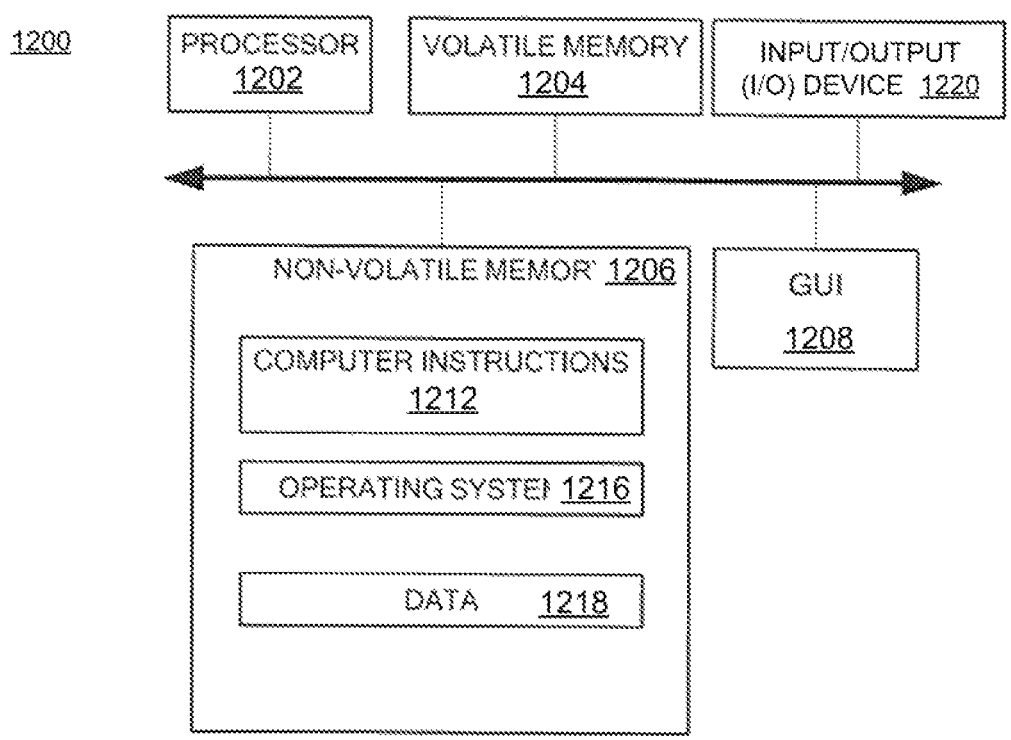
FIG. 12 is a diagram of an example of a computing device, according to aspects of the disclosure.

Referring to FIG. 12, in some implementations, a computing device 1200 may include processor 1202, volatile memory 1204 (e.g., RAM), non-volatile memory 1206 (e.g., a hard disk drive, a solid state drive such as a flash drive, a hybrid magnetic and solid state drive, etc.), graphical user interface (GUI) 1208 (e.g., a touchscreen, a display, and so forth) and input/output (I/O) device 1220 (e.g., a mouse, a keyboard, etc.). Non-volatile memory 1206 stores computer instructions 1212, an operating system 1216 and data 1218 such that, for example, the computer instructions 1212 are executed by the processor 1202 out of volatile memory 1204 to perform at least a portion of any of the processes 700-1100 and/or any other function of the storage system 110, the resource manager 140, and/or the testing system 120.

FIGS. 1-12 are provided as an example only. At least some of the steps discussed with respect to FIGS. 1-12 can be performed concurrently, performed in a different order, or altogether omitted. As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A method comprising:
   identifying, by a resource manager, a resource of a storage system, the resource being one which a testing system lacks permission to use for testing the storage system, the resource including one of a storage server, a storage array, or a virtual machine;
   adding, by the resource manager, the resource to a group of resources which the testing system is permitted to use for testing the storage system, wherein adding the resource to the group includes granting the testing system a temporary permission to use the resource for testing the storage system, the group of resources also including one or more additional resources, which the testing system is granted a permanent permission to use, and of which the testing system is a default owner;
   allocating the resource to a test that is performed by the testing system, wherein allocating the resource includes providing the testing system with at least one of an address or a port number for accessing the resource; and
   removing, by the resource manager, the resource from the group wherein removing the resource from the group includes revoking the temporary permission,
   wherein the grant of temporary permission to use the resource includes transferring ownership of the resource from a default owner of the resource to the testing system, and the revocation of the temporary permission includes transferring the ownership of the resource from the testing system back to the default owner of the resource.

2. The method of claim 1, further comprising:
   receiving, by the resource manager, a resource request that is associated with the test,
   wherein the resource is allocated to the test in response to the resource request, and
   wherein the resource is identified and added to the group before the resource request is received.

3. The method of claim 1, further comprising:
   receiving, by the resource manager, a resource request that is associated with the test,
   wherein the resource is allocated to the test in response to the resource request,
   wherein the resource is identified and added to the group after the request is received, and
   wherein the resource is added to the group in response to the resource matching a set of resource parameters that are specified by the request.

4. The method of claim 1, wherein the resource is added to the group in response to detecting that a load of the resource is below a predetermined threshold.

5. The method of claim 1, wherein the permission is revoked based on an outcome of the test.

6. The method of claim 1, wherein the resource is added to the group of resources that are accessible by the storage system at a beginning of a predetermined time period, and the resource is removed from the group of resources at an end of the predetermined time period.

7. The method of claim 1, wherein the group of resources which the testing system is permitted to use is defined using a resource database, adding the resource to the group of resources includes storing an entry corresponding to the resource to the resource database, and removing the resource from the group includes deleting the entry from the resource database.

8. A system, comprising:
   a memory; and
   one or more processors operatively coupled to the memory, the one or more processors being configured to perform the operations of:
   identifying a resource of a storage system, the resource being one which a testing system lacks permission to use for testing the storage system, the resource including one of a storage server, a storage array, or a virtual machine;
   adding the resource to a group of resources which the testing system is permitted to use for testing the storage system, wherein adding the resource to the group includes granting the testing system a temporary permission to use the resource for testing the storage system, the group of resources also including one or more additional resources, which the testing system is granted a permanent permission to use, and of which the testing system is a default owner;

allocating the resource to a test that is performed by the testing system, wherein allocating the resource includes providing the testing system with at least one of an address or a port number for accessing the resource; and removing the resource from the group wherein removing the resource from the group includes revoking the temporary permission, wherein the grant of temporary permission to use the resource includes transferring ownership of the resource from a default owner of the resource to the testing system, and the revocation of the temporary permission includes transferring the ownership of the resource from the testing system back to the default owner of the resource.

9. The system of claim 8, wherein:

the one or more processors are further configured to perform the operation of receiving a resource request that is associated with the test, the resource is allocated to the test in response to the resource request, and the resource is identified and added to the group before the resource request is received.

10. The system of claim 8, wherein:

the one or more processors are further configured to perform the operation of receiving a resource request that is associated with the test, the resource is allocated to the test in response to the resource request, the resource is identified and added to the group after the request is received, and the resource is added to the group in response to the resource matching a set of resource parameters that are specified by the request.

11. The system of claim 8, wherein the resource is added to the group in response to detecting that a load of the resource is below a predetermined threshold.

12. The system of claim 8, wherein the permission is revoked based on an outcome of the test.

13. The system of claim 8, wherein the resource is added to the group of resources that are accessible by the storage system at a beginning of a predetermined time period, and the resource is removed from the group of resources at an end of the predetermined time period.

14. The system of claim 8, wherein the group of resources which the testing system is permitted to use is defined using a resource database, adding the resource to the group of resources includes storing an entry corresponding to the resource to the resource database, and removing the resource from the group includes deleting the entry from the resource database.

15. A non-transitory computer-readable storage medium storing processor-executable instructions, which, when executed by one or more processors, cause the one or more processors to perform the operations of:

identifying a resource of a storage system, the resource being one which a testing system lacks permission to use for testing the storage system, the resource including one of a storage server, a storage array, or a virtual machine;

adding the resource to a group of resources which the testing system is permitted to use for testing the storage system, wherein adding the resource to the group includes granting the testing system a temporary permission to use the resource for testing the storage system, the group of resources also including one or more additional resources, which the testing system is granted a permanent permission to use, and of which the testing system is a default owner;

allocating the resource to a test that is performed by the testing system, wherein allocating the resource includes providing the testing system with at least one of an address or a port number for accessing the resource; wherein removing the resource from the group wherein removing the resource from the group includes revoking the temporary permission, wherein the grant of temporary permission to use the resource includes transferring ownership of the resource from a default owner of the resource to the testing system, and the revocation of the temporary permission includes transferring the ownership of the resource from the testing system back to the default owner of the resource.

16. The non-transitory computer-readable storage medium of claim 15, wherein:

the processor-executable instructions further cause the one or more processors to perform the operation of receiving a resource request that is associated with the test, the resource is allocated to the test in response to the resource request, and the resource is identified and added to the group before the resource request is received.

17. The non-transitory computer-readable storage medium of claim 15, wherein:

the processor-executable instructions further cause the one or more processors to perform the operation of receiving a resource request that is associated with the test, the resource is allocated to the test in response to the resource request, the resource is identified and added to the group after the request is received, and the resource is added to the group in response to the resource matching a set of resource parameters that are specified by the request.

18. The non-transitory computer-readable storage medium of claim 15, wherein the resource is added to the group in response to detecting that a load of the resource is below a predetermined threshold.

19. The non-transitory computer-readable storage medium of claim 15, wherein the permission is revoked based on an outcome of the test.

20. The non-transitory computer-readable storage medium of claim 15, wherein the resource is added to the group of resources that are accessible by the storage system at a beginning of a predetermined time period, and the resource is removed from the group of resources at an end of the predetermined time period.

* * * * *